(12) United States Patent
Toh et al.

(10) Patent No.: US 9,054,209 B2
(45) Date of Patent: Jun. 9, 2015

(54) COMPACT CHARGE TRAP MULTI-TIME PROGRAMMABLE MEMORY

(75) Inventors: Eng Huat Toh, Singapore (SG); Khee Yong Lim, Singapore (SG); Shyue Seng Tan, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 266 days.

(21) Appl. No.: 13/587,072

(22) Filed: Aug. 16, 2012

(65) Prior Publication Data

US 2014/0048865 A1    Feb. 20, 2014

(51) Int. Cl.
| | |
|---|---|
| *H01L 29/792* | (2006.01) |
| *H01L 21/28* | (2006.01) |
| *H01L 29/423* | (2006.01) |
| *H01L 29/66* | (2006.01) |

(52) U.S. Cl.
CPC ........ *H01L 29/792* (2013.01); *H01L 21/28282* (2013.01); *H01L 29/4234* (2013.01); *H01L 29/66833* (2013.01)

(58) Field of Classification Search
CPC ............ H01L 29/792; H01L 29/66833; H01L 21/28282; H01L 29/4234
USPC ......................................................... 257/324
See application file for complete search history.

(56) References Cited

U.S. PATENT DOCUMENTS

2011/0211394 A1* 9/2011 Scheiper et al. ......... 365/185.18

* cited by examiner

*Primary Examiner* — Peniel M Gumedzoe
*Assistant Examiner* — Christopher Johnson
(74) *Attorney, Agent, or Firm* — Ditthavong & Steiner, P.C.

(57) ABSTRACT

A method for enabling fabrication of memory devices requiring no or minimal additional mask for fabrication having a low cost, a small footprint, and multiple-time programming capability is disclosed. Embodiments include: forming a gate stack on a substrate; forming a source extension region in the substrate on one side of the gate stack, wherein no drain extension region is formed on the other side of the gate stack; forming a tunnel oxide liner on side surfaces of the gate stack and on the substrate on each side of the gate stack; forming a charge-trapping spacer on each tunnel oxide liner; and forming a source in the substrate on the one side of the gate stack and a drain in the substrate on the other side of the gate stack.

12 Claims, 8 Drawing Sheets

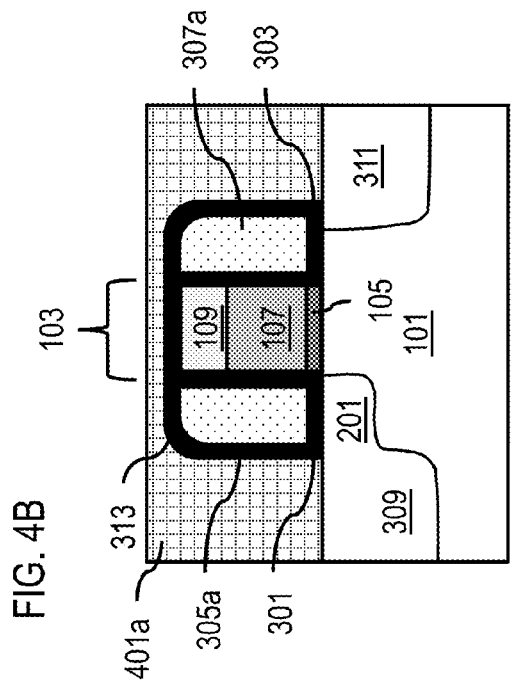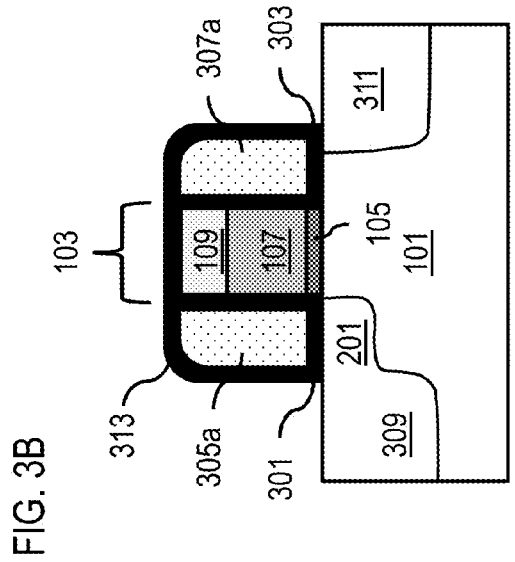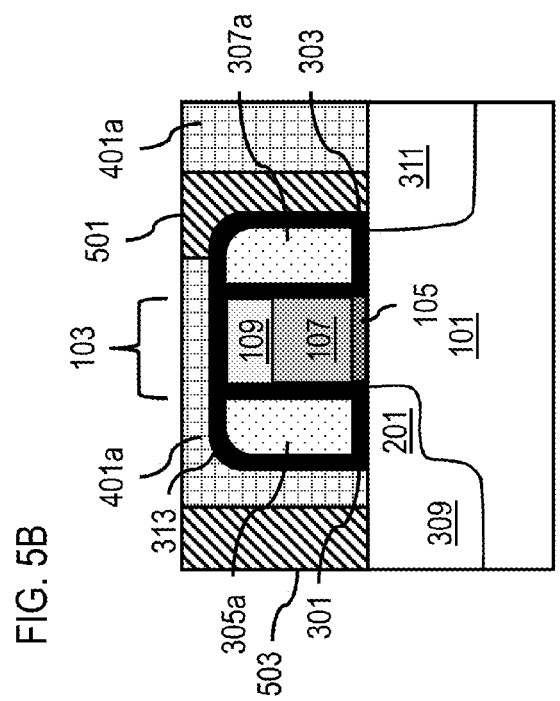

COMPACT CHARGE TRAP MULTI-TIME PROGRAMMABLE MEMORY

TECHNICAL FIELD

The present disclosure relates to fabrication of semiconductor memory cells. The present disclosure is particularly applicable to fabrication of multiple-time programmable (MTP) non-volatile memory (NVM).

BACKGROUND

Non-volatile memory is utilized in a variety of devices, such as televisions, mobile devices, and computer memory, to store information. One-time programmable (OTP) memory devices have been employed, for example using a floating gate as a storage medium, since they require no additional mask and therefore have minimal cost. However, OTP cells require a large footprint due to gate-to-gate limitations and overlay tolerance, and allow for only a single programming, such that device updates are not possible. An example of an MTP memory uses merged nitride spacers as a storage medium. This structure requires no additional mask, allows for multiple programming, and has minimal cost, but requires a large footprint due to the addition of a select transistor. For a more compact structure, a split-gate memory has been employed, which allows for multiple programming and has a small footprint, but it requires an additional mask for a control gate, which complicates the manufacture thereof and increases cost. Thus, traditional memory devices require additional masks for fabrication, have a high cost of production, require a large footprint, and/or are limited to a single-time programming, thereby limiting the size, cost, and manufacturability of fabricated products employing the memory devices, particularly in low cost, small size products, such as portable electronics.

A need therefore exists for methodology enabling fabrication of low cost MTP memory requiring no or minimal additional mask and having a small footprint, and the resulting device.

SUMMARY

An aspect of the present disclosure is a method of fabricating semiconductor memory including, inter alia, forming a tunnel oxide liner on side surfaces of gate stack and on the substrate on each side of the gate stack and forming a charge-trapping (CT) spacer on each tunnel oxide liner.

An additional aspect of the present disclosure is a method of configuring, inter alia, the CT spacer on the drain side of the gate stack to: store charges when a low voltage is applied to the second contact and a program voltage is applied to the first contact; remove the charges when an erase voltage is applied to one of the first and second contacts and a low voltage is applied to the other of the first and second contacts; and determine a current or gate threshold voltage when a read voltage is applied on the second contact and a low voltage is applied to the first contact.

Another aspect of the present disclosure is a device having, inter alia, a tunnel oxide liner on the substrate at each side of the gate stack and on side surfaces of the gate stack; and a CT spacer on each tunnel oxide liner.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a gate stack on a substrate; forming a source extension region in the substrate on one side of the gate stack, wherein no drain extension region is formed on the other side of the gate stack; forming a tunnel oxide liner on side surfaces of the gate stack and on the substrate on each side of the gate stack; forming a CT spacer on each tunnel oxide liner; and forming a source in the substrate on the one side of the gate stack and a drain in the substrate on the other side of the gate stack.

Some aspects include forming an interlayer dielectric (ILD) over an upper surface of the substrate surrounding the gate stack and the CT spacers, after forming the source and drain. Further aspects include: forming, through the ILD over the drain, a first contact at least partially abutting the CT spacer or separated from the CT spacer by a block oxide liner; and forming, through the ILD over the source, a second contact. Some aspects include: forming each CT spacer as a layer over each portion of the tunnel oxide liner, the method further including forming a spacer over each CT spacer. Additional aspects include: removing the gate stack, forming a cavity between each of the tunnel oxide liners; forming a high-k dielectric layer in the cavity; and forming a replacement metal gate (RMG) electrode on the high-k layer, prior to forming the first and second contacts. Some aspects include forming a hardmask layer on the RMG electrode, prior to forming the first and second contacts, the hardmask layer being formed by recessing the RMG electrode and depositing the hardmask layer in the recess or by depositing a hardmask material over the RMG electrode, tunnel oxide liners, and CT spacers, and lithographically defining and etching the hardmask layer. Further aspects include: forming the high-k layer on side surfaces of the cavity; forming a work-function tuning layer of titanium nitride (TiN), tantalum nitride (TaN), titanium aluminum nitride (TiAlN), lanthanum (La), lanthanum oxide ($La_2O_3$), or a combination thereof on the high-k layer. Additional aspects include forming the first and second contacts by forming first and second contact holes, forming block oxide liners on side surfaces of the contact holes, and filling the contact holes with a contact material. Some aspects include configuring the CT spacer on the drain side of the gate stack to: store charges when a low voltage is applied to the second contact and a program voltage is applied to the first contact; remove the charges when an erase voltage is applied to one of the first and second contacts and a low voltage is applied to the other of the first and second contacts; and determine a current or gate threshold voltage when a read voltage is applied on the second contact and a low voltage is applied to the first contact. Additional aspects include: forming the tunnel oxide liners of oxide using an in-situ steam generation (ISSG) process, a high temperature oxide (HTO), silicon oxynitride (SiON), multiple layers of oxide nitride oxide (ONO), or a combination thereof; and forming the CT spacers of nitride, silicon nitride (SiN), SiON, hafnium oxide ($HfO_2$), TaN, or a combination thereof.

Another aspect of the present disclosure is a device including: a substrate; a gate stack on the substrate; a source and drain in the substrate at opposite sides, respectively, of the gate stack; a source extension region in the substrate adjacent the source region, wherein no drain extension region is formed on the other side of the gate stack; a tunnel oxide liner on the substrate at each side of the gate stack and on side surfaces of the gate stack; and a CT spacer on each tunnel oxide liner.

Aspects include a device including a source extension region in the substrate adjacent the source region, wherein no drain extension region is formed on the other side of the gate stack. Some aspects include: an ILD on the substrate surrounding the gate stack and CT spacers; a first contact, through the ILD over the drain, at least partially abutting to the CT spacer or separated from the CT spacer by a block oxide liner; and a second contact, through the ILD over the source. Further aspects include: a first block oxide liner on each side of the first contact; and a second block oxide liner on each side of the second contact. Additional aspects include a device wherein each CT spacer is formed as a layer over each portion of the tunnel oxide liner, the device further including a spacer over each CT spacer. Further aspects include a device wherein the gate stack includes: a high-k dielectric layer; a work-function tuning layer on the high-k dielectric layer; and a metal gate electrode on the work-function tuning layer. Some aspects include: the high-k dielectric layer on side surfaces of the metal gate electrode; and the work-function tuning layer being titanium nitride (TiN), tantalum nitride (TaN), titanium aluminum nitride (TiAlN), lanthanum (La), lanthanum oxide ($La_2O_3$), or a combination thereof. Additional aspects include the tunnel oxide liners being formed of an oxide using an ISSG process, a HTO, a SiON, multiple layers of ONO, or a combination thereof. Further aspects include the CT spacers being formed of nitride, SiN, SiON, $HfO_2$, TaN, or a combination thereof.

Another aspect of the present disclosure is a method including: providing a dummy gate stack including an oxide layer and a dummy gate on a substrate; forming a source extension region in the substrate on one side of the dummy gate stack, wherein a drain extension region is not formed on the other side of the dummy gate stack; forming a tunnel oxide liner of oxide using an in-situ steam generation (ISSG) process, a high temperature oxide (HTO), silicon oxynitride (SiON), multiple layers of oxide nitride oxide (ONO), or a combination thereof on each side surface of the dummy gate stack and on the substrate at each side of the dummy gate stack; forming a charge-trapping (CT) spacer of nitride, silicon nitride (SiN), silicon oxynitride (SiON), hafnium oxide ($HfO_2$), tantalum nitride (TaN), or a combination thereof on each tunnel oxide liner; forming a source in the substrate on the one side of the dummy gate stack adjacent the source extension region, and a drain in the substrate on the other side of the dummy gate stack; depositing an interlayer dielectric (ILD) on the substrate surrounding the dummy gate stack and CT spacers; removing the dummy gate, forming a cavity between the tunnel oxide liners; forming a high-k dielectric layer in the cavity; forming a replacement metal gate (RMG) electrode in the cavity; forming a hardmask layer on the RMG electrode, the hardmask layer being formed by recessing the RMG electrode and depositing the hardmask layer in the recess, or forming the hardmask layer over the RMG electrode and tunnel oxide liners; forming, through the ILD over the drain, a first contact trench at least partially abutting the CT spacer or separated from the CT spacer by a block oxide liner; forming, through the ILD over the source, a second contact trench; and forming a first and second contact of Al, W, Ta, Ti, TaN, TiN, or a combination thereof on the first and second block oxide liners, respectively.

Aspects include: forming each CT spacer as a layer over the tunnel oxide liner; forming a spacer on each CT spacer, prior to forming the source and drain in the substrate; forming the high-k dielectric layer on bottom and side surfaces of the cavity; and forming a work function tuning layer on the high-k dielectric layer. Additional aspects include configuring the CT spacer on the drain side of the gate stack to: store charges when a low voltage is applied to the second contact and a program voltage is applied to the first contact; remove the charges when an erase voltage is applied to one of the first and second contacts and a low voltage is applied to the other of the first and second contacts; and determine a current or gate threshold voltage when a read voltage is applied on the second contact and a low voltage is applied to the first contact.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1, 2, 3B, 4B, and 5B schematically illustrate sequential steps of another method, in accordance with another exemplary embodiment;

FIGS. 1, 2, 3C, 4C, and 5C schematically illustrate sequential steps of an additional method, in accordance with a third exemplary embodiment;

FIGS. 1, 2, 3D, 4B, and 5D schematically illustrate sequential steps of an additional method, in accordance with a fourth exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of high cost, large footprint, single-time programming, and a necessity of an additional mask attendant upon fabrication of non-volatile memory devices. In accordance with embodiments of the present disclosure, a tunnel oxide liner is formed and a CT spacer is formed on each tunnel oxide liner. The CT spacer is configured, inter alia, on the drain side of the gate stack to: store charges when a low voltage is applied to the second contact and a program voltage is applied to the first contact; remove the charges when an erase voltage is applied to one of the first and second contacts and a low voltage is applied to the other of the first and second contacts; and determine a current or gate threshold voltage when a read voltage is applied on the second contact and a low voltage is applied to the first contact.

Methodology in accordance with embodiments of the present disclosure includes: forming a gate stack on a substrate; forming a source extension region in the substrate on one side of the gate stack, wherein no drain extension region is formed on the other side of the gate stack; forming a tunnel oxide liner on side surfaces of the gate stack and on the substrate on each side of the gate stack; forming a CT spacer on each tunnel oxide liner; and forming a source in the substrate on the one side of the gate stack and a drain in the substrate on the other side of the gate stack.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2:
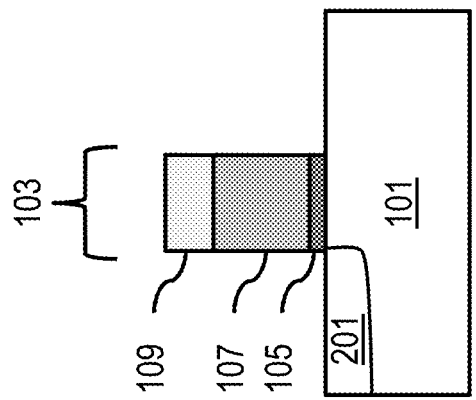
FIGS. 1, 2, 3A, 4A, and 5A schematically illustrate sequential steps of a method, in accordance with an exemplary embodiment.
Figure 1:
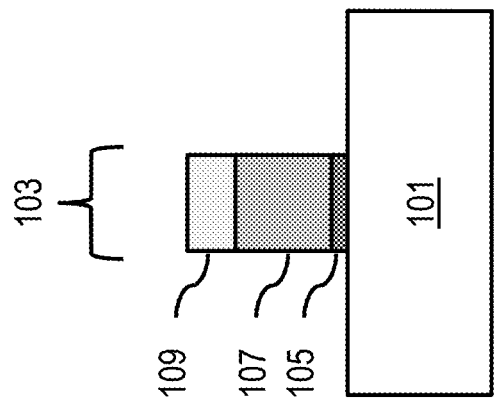

Adverting to FIG. 1 in accordance with exemplary embodiments, a substrate 101, for example a bulk silicon substrate, is provided with a gate stack 103 having a gate electrode or a dummy gate electrode for an RMG. As illustrated in FIG. 1, gate stack 103 contains a gate dielectric layer 105, a gate electrode 107, and a hardmask 109 formed over the gate electrode 107. The dielectric layer 105 may be formed on the side surfaces of the gate electrode 107 (not shown for illustrative convenience). The gate dielectric layer 105 may be a formed of a high-k material, for example $HfO_2$, HfSiON or AlHfO, and the gate electrode 107 may be a metal gate electrode, e.g. of Al, W, Ta, Ti, TaN, TiN. A work-function layer (not shown for illustrative convenience) of TiN, TiAlN, or TaN, for example, may be formed on the high-k dielectric layer 105. The gate electrode 107 may also be formed of polysilicon or amorphous silicon, over an oxide or SiON gate dielectric layer 105. Alternatively, the gate electrode 107 may be a dummy gate electrode for an RMG process, formed of polysilicon or amorphous silicon, over gate dielectric layer 105, formed of oxide or SiON. The substrate 101 and gate stack 103 may be formed using conventional front-end-of-line (FEOL) steps for forming a gate first gate electrode or for forming a dummy gate electrode for an RMG. Adverting to FIG. 2, a source extension region 201 is formed in the substrate 101 at one side of gate stack 103, but no corresponding drain extension region is formed at the other side of gate stack 103.

Figure 3A:
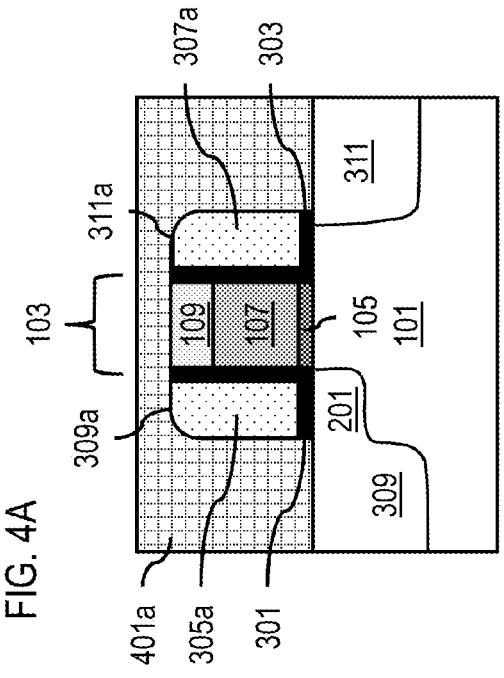
Figure 4A:
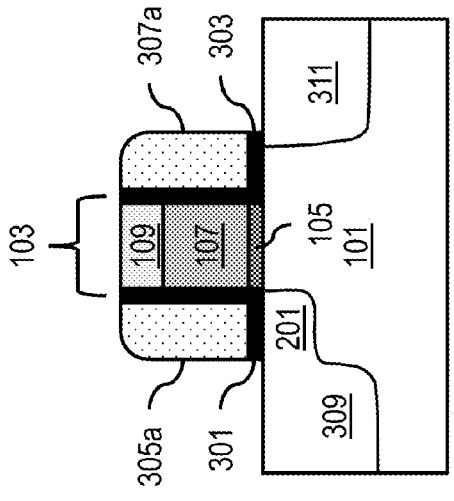
Figure 5A:
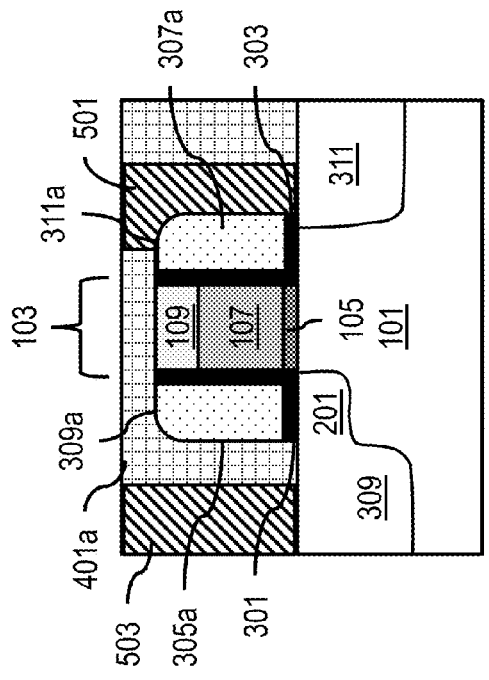

In accordance with a first embodiment, a gate first process is illustrated in FIGS. 3A, 4A and 5A. Adverting to FIG. 3A, tunnel oxide liners 301 and 303 are formed on opposite side surfaces of the gate stack 103 and on the substrate 101 on each side of the gate stack 103. The tunnel oxide liners 301 and 303 may be formed of oxide using an ISSG process, a HTO, SiON, multiple layers of ONO, or a combination thereof, to a thickness of between 2 nanometers (nm) and 20 nm. CT spacers 305a and 307a are then formed on tunnel oxide liners 301 and 303, respectively. The CT spacers 305a and 307a are formed of nitride, SiN, SiON, $HfO_2$, TaN, or a combination thereof, to a width of between 10 nm and 100 nm and a thickness of between 2 nm and 20 nm. Additionally, a source region 309 is formed in the substrate 101 on the side of the gate stack 103 having source extension region 201, and a drain region 311 is formed in the substrate 101 on the other side of the gate stack 103. Silicidation of the source region 309 and the drain region 311 (not shown for illustrative convenience) may be performed.

As illustrated in FIG. 4A, an ILD 401a is formed of $SiO_2$, nitrides, and/or doped $SiO_2$ (e.g., BPSG, porous low-k materials, etc.) to a thickness of between 50 nm and 1,000 nm over an upper surface of the substrate 101. A first contact 501 may then be formed through the ILD 401a over the drain region 311, at least partially abutting the CT spacer 307a, and a second contact 503 may be formed, through the ILD 401a over the source region 309, separated from the CT spacer 305a, as shown in FIG. 5A. Alternatively, the second contact 503 may be abutting (not shown for illustrative convenience) CT spacer 305a. Contacts 501 and 503 may be formed as self-aligned contacts (SACs), of W, Al, TaN, and/or TiN, to a width of between 5 nm and 100 nm and a height of between 50 nm and 1,000 nm.

Adverting to FIGS. 3B, 4B, and 5B a second gate first embodiment is illustrated. Tunnel oxide liners 301 and 303, CT spacers 305a and 307a, and source and drain regions 309 and 311, respectively, are all formed similar to those described with respect to FIG. 3A. However, as shown in FIG. 3B, a block oxide 313 is formed over CT spacers 305a and 307a and hardmask 109. Alternatively, block oxide 313 may be formed as a second set of spacers adjacent to CT spacers 305a and 307a.

As illustrated in FIG. 4B, an ILD 401a is formed of $SiO_2$, nitrides, and/or doped $SiO_2$ (e.g., BPSG, porous low-k materials, etc.) to a thickness of between 50 nm and 1,000 nm over an upper surface of the substrate 101. A first contact 501 may then be formed through the ILD 401a over the drain region 311, at least partially abutting block oxide 313, and a second contact 503 may be formed, through the ILD 401a over the source region 309, separated from the block oxide 313, as shown in FIG. 5B Alternatively, the second contact 503 may be abutting (not shown for illustrative convenience) CT spacer 305a. Contacts 501 and 503 may be formed as described with respect to FIG. 5A.

Figure 3C:
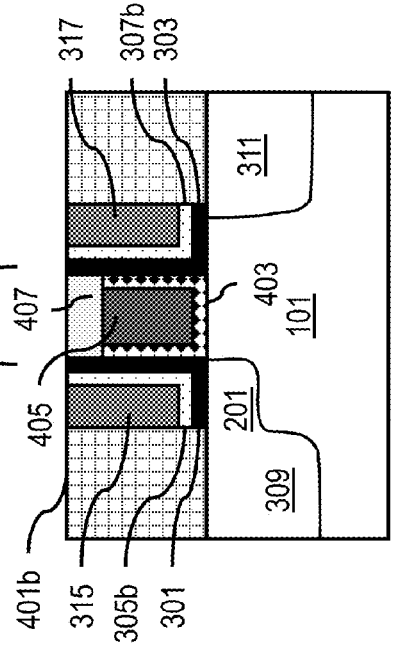
Figure 4C:
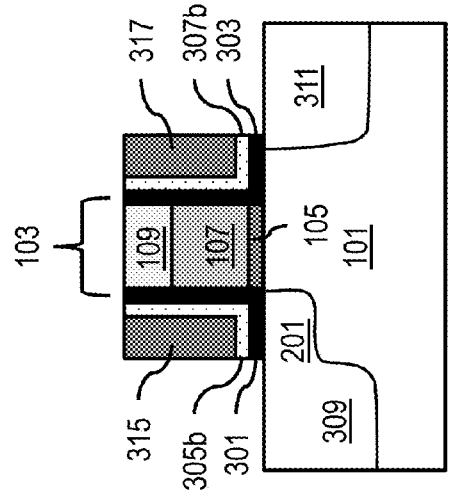
Figure 5C:
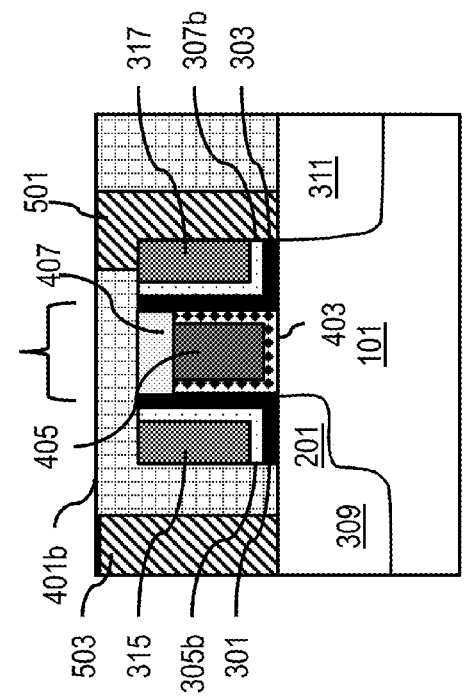

FIGS. 3C, 4C, and 5C illustrate a third embodiment in which an RMG is formed. Adverting to FIG. 3C, a gate dielectric layer 105, e.g. an oxide layer, a dummy gate electrode 107, e.g. of polysilicon or amorphous silicon, having a thickness of between 20 nm and 200 nm, and a hardmask 109 of oxide, SiON, or TiN having a thickness of between 5 nm and 100 nm, is to be replaced by an RMG process with a RMG electrode and high-k layer. In the third embodiment, substrate 101, gate stack 103, source extension region 201 and tunnel oxide liners 301 and 303 are formed similar to those described with respect to FIGS. 1, 2, 3A, and 3B. CT spacers 305b and 307b are formed on tunnel oxide liners 301 and 303, respectively. Then, the source and drain regions 309 and 311 are formed similar to those described with respect to FIGS. 3 A and 3B. CT spacers 305b and 307b may be formed as in FIG. 3A (not shown for illustrative convenience), or may be formed as a thin layer on the horizontal surfaces (over substrate 101) and vertical surfaces (opposite sidewalls of gate 103) of tunnel oxide liners 301 and 303, as shown in FIG. 3C. In the latter case, spacers 315 and 317 are formed over CT spacer 305b and 307b, respectively. Further spacer modifications (not shown for illustrative convenience) of, for instance, an additional blocking oxide liner or spacer could be formed after formation of the source and drain regions 309 and 311.

Adverting to FIG. 4C, an ILD layer 401b is formed of $SiO_2$, nitrides, and/or doped $SiO_2$ (e.g., BPSG, porous low-k materials, etc.) to a thickness of between 50 nm and 1,000 nm over an upper surface of the substrate 101. Chemical mechanical polishing (CMP) is performed to expose hardmask 109. Then, hardmask 109, dummy gate electrode 107, and gate dielectric layer 105 are removed by conventional processes, forming a cavity between tunnel oxide liners 301 and 303. A high-k dielectric layer 403, such as $HfO_2$, HfSiON or AlHfO, is deposited on the bottom and side surfaces of the cavity, and a metal gate 405, e.g. of Al, W, Ta, Ti, TaN, TiN, is formed to fill the remainder of the cavity. The metal gate 405 may then be recessed, and a hardmask 407 may be formed over the metal gate electrode 405 by filling the recess and performing CMP, completing RMG electrode stack 409. Additionally, a work-function tuning layer of TiN, TaN, TiAlN, La, $La_2O_3$, or a combination thereof may be formed (not shown for illustrative convenience) on the high-k layer 403. Contacts 501 and 503 may then be formed as illustrated in FIG. 5C, similar to the contacts formed in FIGS. 5A and 5B.

Figure 4D:
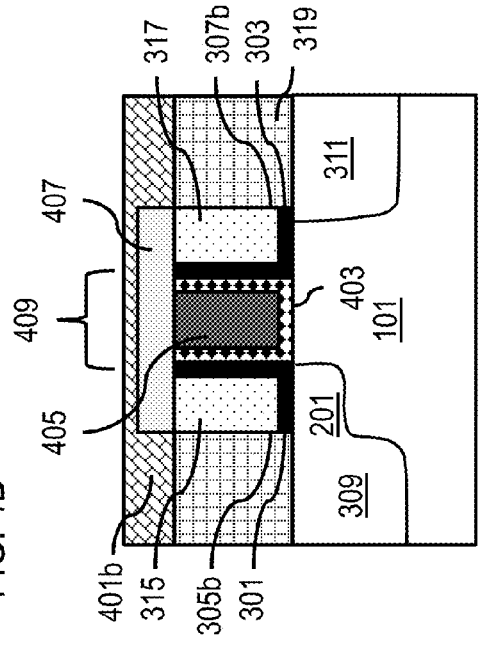
Figure 5D:
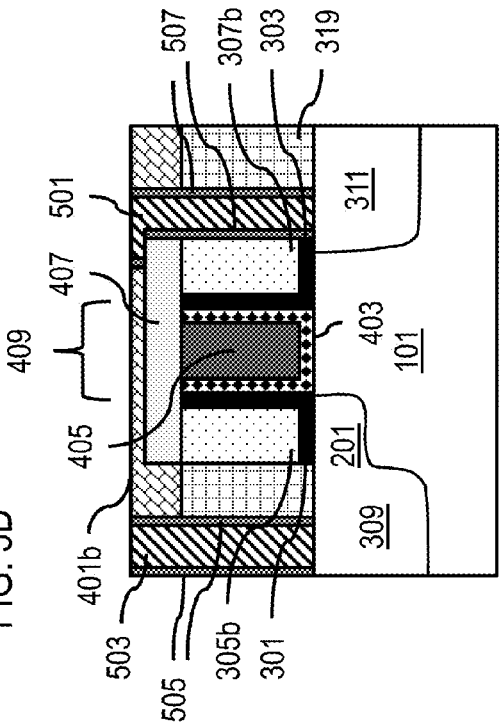
Figure 3D:
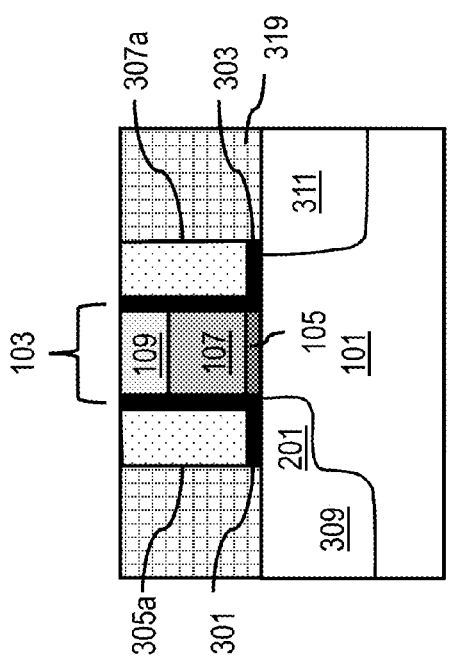

FIGS. 3D, 4D and 5D illustrate a fourth embodiment in which another RMG is formed. As illustrated in FIG. 3D, tunnel oxide liners 301 and 303, CT spacers 305a and 307a, and source and drain regions 309 and 311, respectively, are all formed similar to those described with respect to FIG. 3C (without spacers 315 and 317). Then, ILD layer 319 is deposited over an upper surface of the substrate 101 and a traditional CMP process is performed. Adverting to FIG. 4D, the high-k layer 403 and metal gate 405 are formed similar to those described with respect to FIG. 4C (without spacers 315 and 317). Additionally, as shown in FIG. 4D, hardmask 407 is deposited on the metal gate 405, tunnel oxide liners 301 and 303, and CT spacers 315 and 317, and defined by a traditional lithography and etching process. Next, an ILD 401b is deposited and CMP is again performed. Adverting to FIG. 5D, an etching is performed of contact holes over source and drain regions 309 and 311, respectively. Next, block oxide liners 505 and 507 may be deposited on side surfaces of the contact holes and etched, and the first and second contacts 501 and 503 may be formed of Al, W, Ta, Ti, TaN, TiN, or a combination thereof on the block oxide liners 505 and 507. Alternatively, block oxide liners 505 and 507 may be omitted (not shown for illustrative convenience) and contacts 501 and 503 may be formed directly in the contact holes.

FIGS. 6A through 6D schematically illustrate steps of a method of operation of the devices of FIGS. 5A through 5D, in accordance with an exemplary embodiment. FIGS. 6A through 6D contain a drain side 601 having a tunnel oxide liner 603, CT spacer 605 and first contact 607, a gate stack 609, and a source side 611 having a second contact 613.

Figure 6A:
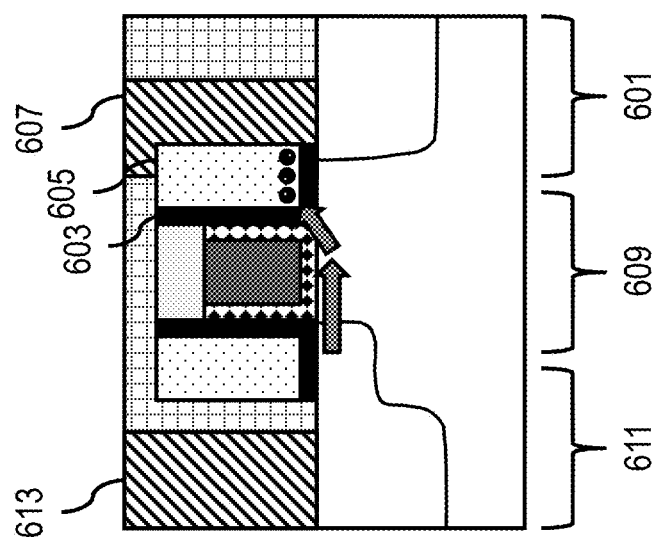
FIGS. 6A through 6D schematically illustrate steps of a method of operation of the devices of FIGS. 5A through 5D, in accordance with an exemplary embodiment.

FIG. 6A illustrates a programming of a memory cell. Specifically, CT spacer 605 on the drain side 601 of a gate stack 609 is configured to store charges when a program voltage of between 3 volts and 10 volts is applied to the first contact 607, a low or neutral voltage is applied to the second contact 613, and an on voltage of between 0.5 volts and 5 volts is applied to the gate stack 609.

Figure 6B:
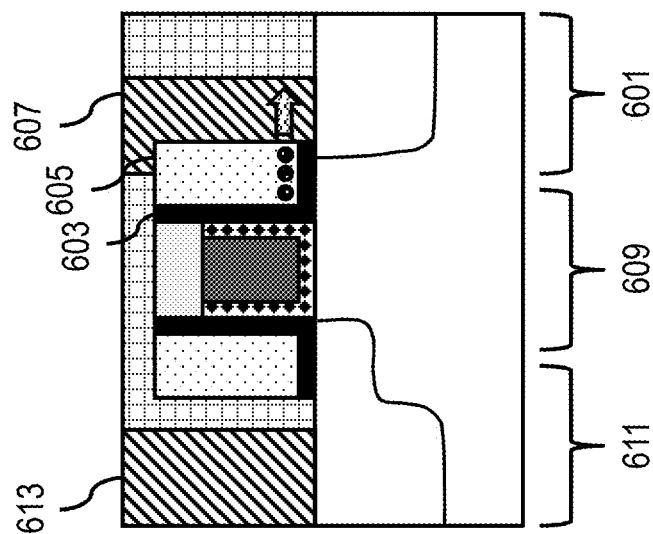

FIG. 6B illustrates a first method of erasing of a memory cell by removing charges through the tunnel oxide 603 to the channel. Specifically, CT spacer 605 on the drain side 601 of a gate stack 609 is configured to remove charges when an erase voltage of between 5 volts and 10 volts is applied to the second contact 613, a floating or neutral voltage is applied to the first contact 607 and an on voltage of between 0.5 volts and 5 volts is applied to the gate stack 609.

Figure 6C:
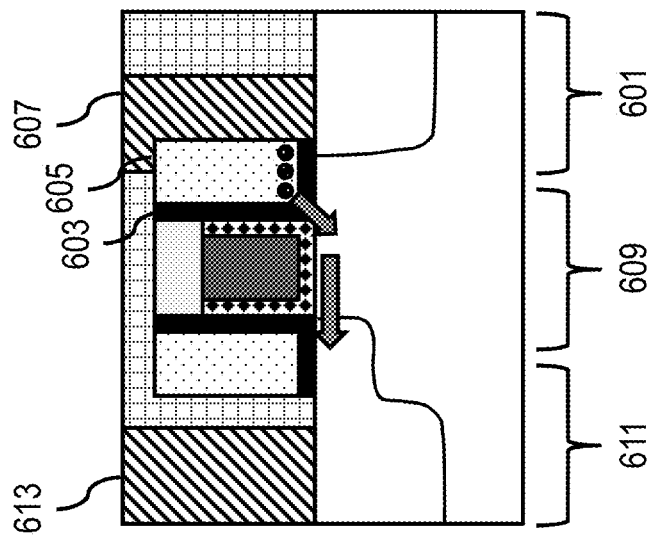

FIG. 6C illustrates a second method of erasing of a memory cell by removing charges through the first contact 607. Specifically, CT spacer 605 on the drain side 601 of a gate stack 609 is configured to remove charges when an erase voltage of between 5 volts and 10 volts is applied to the first contact 607, a floating or neutral voltage is applied to the second contact 613 and a floating or neutral voltage is applied to the gate stack 609.

Figure 6D:
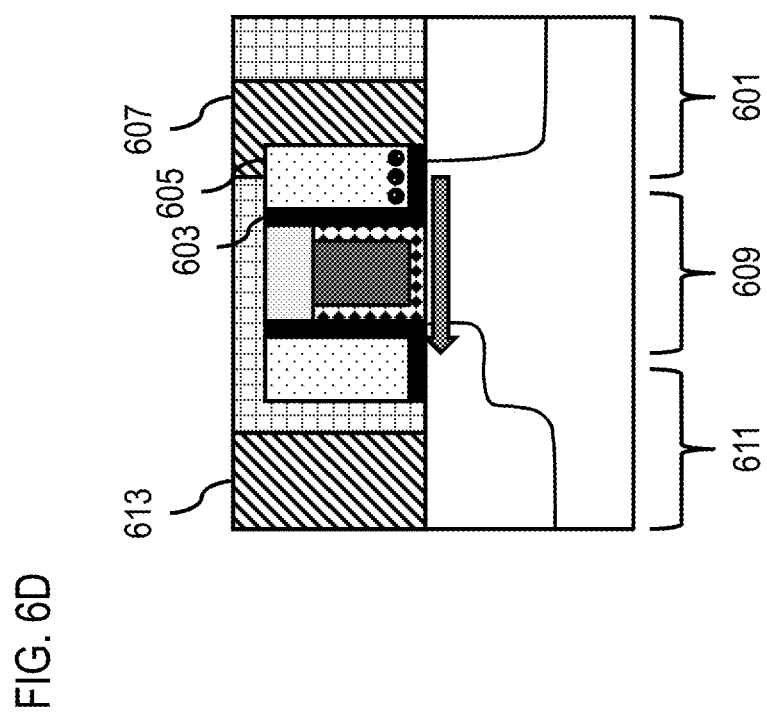

FIG. 6D illustrates a reading of a memory cell. Specifically, CT spacer 605 on the drain side 601 of a gate stack 609 is configured to provide a potential barrier or read voltage on the second contact 613 of between a low or neutral voltage, e.g. 0 volts, and 5 volts when a voltage of between a low or neutral voltage and 5 volts is applied to the gate stack 609 and a low or neutral voltage is applied to the first contact 607. Additionally, the memory cell illustrated in FIG. 6D is read by determining a state of the memory cell based on a threshold voltage or current flowing in the channel.

The embodiments of the present disclosure can achieve several technical effects, including formation of memory devices requiring no additional mask for fabrication, having a low cost, a small footprint, and multiple-time programming capability. The present disclosure enjoys industrial applicability in any of various types of highly integrated semiconductor devices, particularly in devices configured to store information, such as televisions, mobile devices, and personal computers.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a gate stack on a substrate;
    forming a source extension region in the substrate on one side of the gate stack, wherein no drain extension region is formed on the other side of the gate stack;
    forming a tunnel oxide liner on side surfaces of the gate stack and on the substrate on each side of the gate stack;
    forming a charge-trapping (CT) spacer on each tunnel oxide liner; and
    forming a source in the substrate on the one side of the gate stack and a drain in the substrate on the other side of the gate stack,
    wherein the source extension region and source are formed on the one side of the gate stack and the drain is formed on the other side of the gate stack with no drain extension region being formed.

2. The method according to claim 1, further comprising:
    forming an interlayer dielectric (ILD) over an upper surface of the substrate surrounding the gate stack and the CT spacers, after forming the source and drain.

3. The method according to claim 2, comprising:
    forming, through the ILD over the drain, a first contact at least partially abutting the CT spacer or separated from the CT spacer by a block oxide liner; and
    forming, through the ILD over the source, a second contact.

4. The method according to claim 3, comprising:
    removing the gate stack, forming a cavity between each of the tunnel oxide liners;
    forming a high-k dielectric layer in the cavity; and
    forming a replacement metal gate (RMG) electrode on the high-k dielectric layer, prior to forming the first and second contacts.

5. The method according to claim 4, comprising:
forming a hardmask layer on the RMG electrode, prior to forming the first and second contacts, the hardmask layer being formed by recessing the RMG electrode and depositing the hardmask layer in the recess or by depositing a hardmask material over the RMG electrode, tunnel oxide liners, and CT spacers, and lithographically defining and etching the hardmask layer.

6. The method according to claim 5, comprising:
forming each CT spacer as a layer over each portion of the tunnel oxide liner, the method further comprising:
forming a spacer over each CT spacer.

7. The method according to claim 5, further comprising:
forming the high-k dielectric layer on side surfaces of the cavity; and
forming a work-function tuning layer of titanium nitride (TiN), tantalum nitride (TaN), titanium aluminum nitride (TiAlN), lanthanum (La), lanthanum oxide ($La_2O_3$), or a combination thereof on the high-k layer.

8. The method according to claim 5, comprising forming the first and second contacts by forming first and second contact holes, forming block oxide liners on side surfaces of the first and second contact holes, and filling the first and second contact holes with a contact material.

9. The method according to claim 6, further comprising configuring the CT spacer on the drain side of the gate stack to:
store charges when a low voltage is applied to the second contact and a program voltage is applied to the first contact;
remove the charges when an erase voltage is applied to one of the first and second contacts and a low voltage is applied to the other of the first and second contacts; and
determine a current or gate threshold voltage when a read voltage is detected on the second contact and a low voltage is applied to the first contact.

10. A method comprising:
providing a dummy gate stack comprising an oxide layer and a dummy gate on a substrate;
forming a source extension region in the substrate on one side of the dummy gate stack, wherein a drain extension region is not formed on the other side of the dummy gate stack;
forming a tunnel liner of oxide using an in-situ steam generation (ISSG) process, a high temperature oxide (HTO), silicon oxynitride (SiON), multiple layers of oxide nitride oxide (ONO), or a combination thereof on each side surface of the dummy gate stack and on the substrate at each side of the dummy gate stack;
forming a charge-trapping (CT) spacer of nitride, silicon nitride (SiN), silicon oxynitride (SiON), hafnium oxide ($HfO_2$), tantalum nitride (TaN), or a combination thereof on each tunnel liner;
forming a source in the substrate on the one side of the dummy gate stack adjacent the source extension region, and a drain in the substrate on the other side of the dummy gate stack;
depositing an interlayer dielectric (ILD) on the substrate surrounding the dummy gate stack and CT spacers;
removing the dummy gate, forming a cavity where the dummy gate was removed;
forming a high-k dielectric layer in the cavity;
forming a replacement metal gate (RMG) electrode in the cavity;
forming a hardmask layer on the RMG electrode, the hardmask layer being formed by recessing the RMG electrode and depositing the hardmask layer in the recess, or forming the hardmask layer over the RMG electrode and tunnel oxide liners;
forming, through the ILD over the drain, a first contact trench at least partially abutting the CT spacer or separated from the CT spacer by a block oxide liner;
forming, through the ILD over the source, a second contact trench; and
forming a first and second contact of Al, W, Ta, Ti, TaN, TiN, or a combination thereof on the block oxide liner, respectively.

11. The method according to claim 10, comprising:
forming each CT spacer as a layer over the tunnel oxide liner;
forming a spacer on each CT spacer, prior to forming the source and drain in the substrate;
forming the high-k dielectric layer on bottom and side surfaces of the cavity; and
forming a work function tuning layer on the high-k dielectric layer.

12. The method according to claim 10, further comprising configuring the CT spacer on the drain side of the dummy gate stack to:
store charges when a low voltage is applied to the second contact and a program voltage is applied to the first contact;
remove the charges when an erase voltage is applied to one of the first and second contacts and a low voltage is applied to the other of the first and second contacts; and
determine a current or gate threshold voltage when a read voltage is detected on the second contact and a low voltage is applied to the first contact.

* * * * *